(12) United States Patent
Horning et al.

(10) Patent No.: US 10,033,354 B2
(45) Date of Patent: Jul. 24, 2018

(54) SYSTEMS AND METHODS FOR DEVICE TEMPERATURE STABILIZATION

(71) Applicant: Honeywell International Inc., Morristown, NJ (US)

(72) Inventors: Robert D. Horning, Savage, MN (US); Grant H. Lodden, Minnetrista, MN (US)

(73) Assignee: Honeywell International Inc., Morris Plains, NJ (US)

( * ) Notice: Subject to any disclaimer, the term of this patent is extended or adjusted under 35 U.S.C. 154(b) by 388 days.

(21) Appl. No.: 14/716,635

(22) Filed: May 19, 2015

(65) Prior Publication Data
US 2016/0233851 A1 Aug. 11, 2016

Related U.S. Application Data

(60) Provisional application No. 62/114,220, filed on Feb. 10, 2015.

(51) Int. Cl.
*H03K 3/011* (2006.01)
*H01L 35/34* (2006.01)
(Continued)

(52) U.S. Cl.
CPC ............ *H03K 3/011* (2013.01); *B81B 7/0087* (2013.01); *H01L 23/34* (2013.01); *H01L 23/38* (2013.01); *H01L 35/32* (2013.01); *H01L 35/34* (2013.01)

(58) Field of Classification Search
CPC .......... H03K 3/11; H03K 3/011; H01L 35/34; H01L 35/32; H01L 23/38; H01L 23/34; B81B 7/0087
See application file for complete search history.

(56) References Cited

U.S. PATENT DOCUMENTS 4,369,352 A * 1/1983 Bowles .................. F24C 7/087
219/395
4,860,748 A * 8/1989 Chiurco .................. A61F 7/007
607/112
(Continued)

FOREIGN PATENT DOCUMENTS

| CA | 2877959 | 8/2007 |
|---|---|---|
| CN | 103064443 | 4/2013 |
| EP | 2572788 | 3/2013 |

OTHER PUBLICATIONS

Guha et al., "CMOS-Compatible Athermal Silicon Microring Resonators", "Optics Express", Feb. 15, 2010, pp. 3488-3493, vol. 18, No. 4.
(Continued)

*Primary Examiner* — Zeev V Kitov
(74) *Attorney, Agent, or Firm* — Fogg & Powers LLC

(57) ABSTRACT

A temperature stabilized device and method for temperature stabilization are provided. The temperature stabilized device comprises a substrate having a first surface, at least one component mounted on the first surface of the substrate, and a first conformal layer comprising a thermoelectric material, with the first conformal layer over the at least one component. A first temperature control circuit is electrically coupled to the first conformal layer. The first temperature control circuit is configured to control a current through the first conformal layer. The current through the first conformal layer is controlled to maintain the at least one component at a target operating temperature.

17 Claims, 9 Drawing Sheets

(51) Int. Cl.
  *H01L 35/32* (2006.01)
  *B81B 7/00* (2006.01)
  *H01L 23/38* (2006.01)
  *H01L 23/34* (2006.01)

(56) References Cited

U.S. PATENT DOCUMENTS

| | | | | |
|---|---|---|---|---|
| 5,515,682 | A * | 5/1996 | Nagakubo | F25B 21/04 165/259 |
| 5,970,718 | A * | 10/1999 | Arnold | A61F 7/10 607/109 |
| 6,127,619 | A * | 10/2000 | Xi | H01L 35/16 136/201 |
| 6,410,971 | B1 * | 6/2002 | Otey | H01L 35/32 257/467 |
| 7,205,675 | B2 | 4/2007 | McKinnell et al. | |
| 7,439,449 | B1 * | 10/2008 | Kumar | G02B 6/4292 174/254 |
| 2006/0102223 | A1 * | 5/2006 | Chen | H01L 23/38 136/201 |
| 2010/0195851 | A1 * | 8/2010 | Buccafusca | H04R 17/02 381/190 |
| 2011/0248280 | A1 | 10/2011 | Bettencourt et al. | |
| 2013/0061605 | A1 * | 3/2013 | de Rochemont | B64D 15/12 62/3.5 |
| 2014/0070355 | A1 * | 3/2014 | Radhakrishnan | G01J 5/061 257/467 |
| 2015/0208738 | A1 * | 7/2015 | Ganter | A41D 13/005 62/3.5 |

OTHER PUBLICATIONS

Hwang et al., "Micro Thermoelectric Cooler: Planar Multistage", "International Jouranl of Hat and Mass Transfer", Apr. 10, 2008, pp. 1-10.

Lakdawala et al., "Temperature stabilization of CMOS capacitive accelerometers", "Journal of Micromechanics and Microengineering", Jan. 19, 2004, pp. 559-566, Publisher: Institute of Physics Publishing.

Wijngaards et al., "Characterisation and Modelling of Planar On-Chip Integrated Peltier Elements for Highly Localised Thermal Stabilisation and Cooling", "18th IEEE SEMI-THERM Symposium", 2002, pp. 105-112, Publisher: IEEE.

European Patent Office, "Communication under Rule 71(3) EPC from EP Application No. 16154154.5, dated Dec. 12, 2016", from Foreign Counterpart of U.S. Appl. No. 14/716,635, filed Dec. 12, 2016, pp. 1-33, Published in: EP.

European Patent Office, "Extended European Search Report from EP Application No. 16154154.5 dated Jun. 23, 2016", from Foreign Counterpart of U.S. Appl. No. 14/716,635, filed Jun. 23, 2016, pp. 1-5, Published in: EP

* cited by examiner

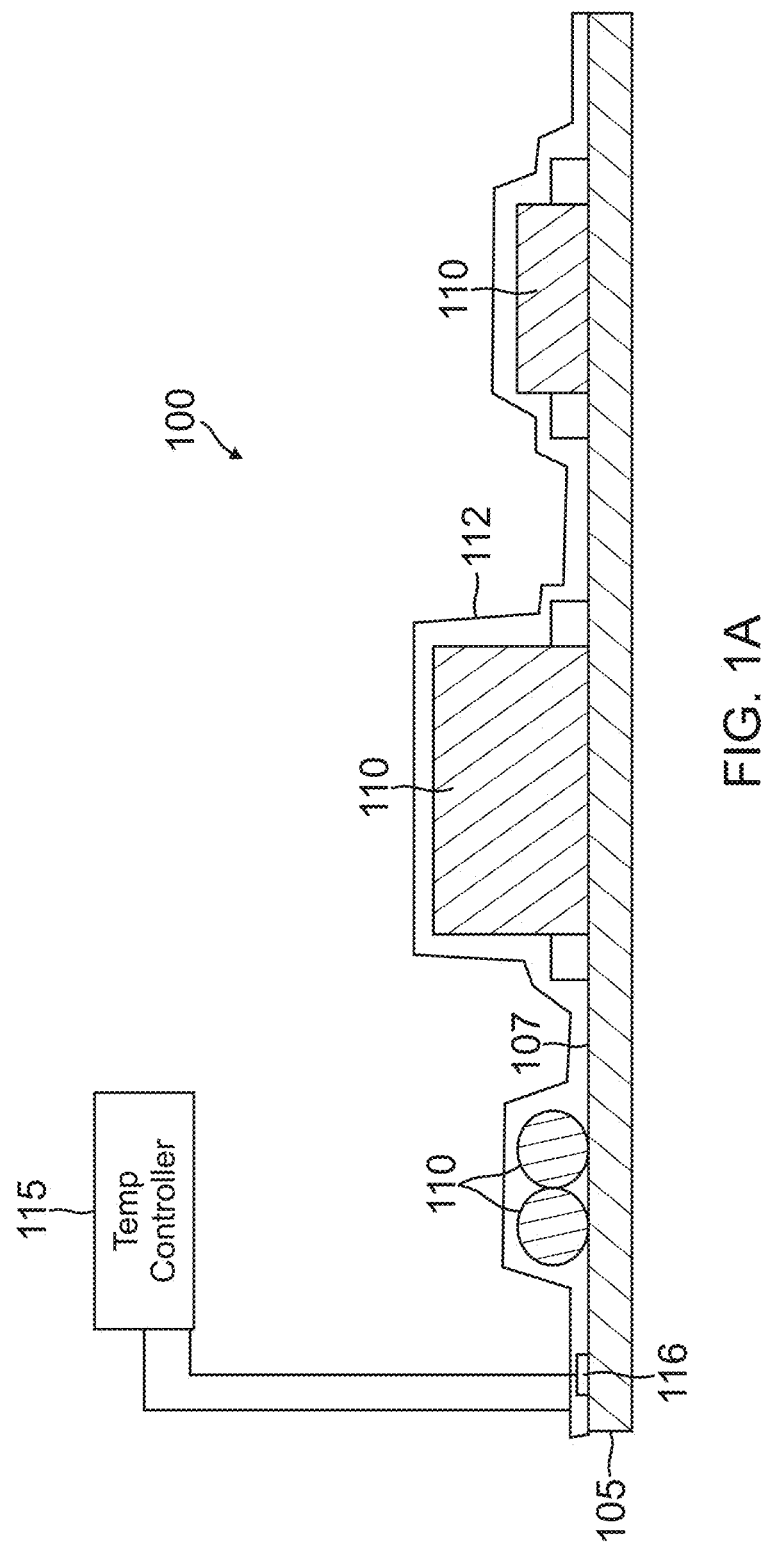

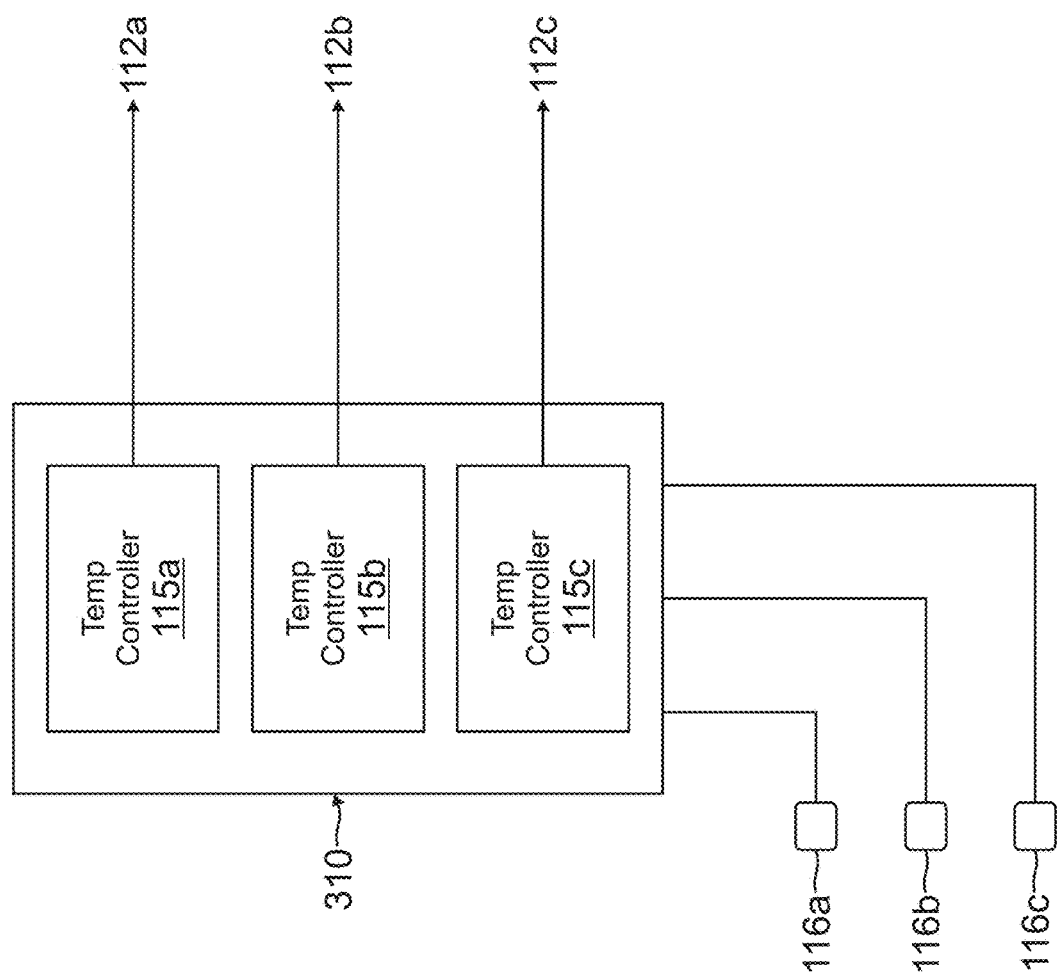

SYSTEMS AND METHODS FOR DEVICE TEMPERATURE STABILIZATION

This application claims the benefit of priority to U.S. Provisional Application No. 62/114,220, filed on Feb. 10, 2015, the disclosure of which is incorporated by reference.

BACKGROUND

Almost all sensors are temperature sensitive. The ability to compensate for this sensitivity plays a dominant role in the ultimate performance of the sensor. One example of such a sensor is a micro-electrical-mechanical systems (MEMS) gyroscope used for inertial measurement.

For many years, temperature stabilization has been used as a way to reduce temperature-induced variation. One common approach is to "ovenize" the sensor or system. This means that a heater in the system raises and stabilizes sensor temperature at some value just a little above the maximum operating temperature of the system. For example, if the device has a normal operating temperature range from −55° C. to +85° C., temperature stabilization could be established at 90° C. to 95° C. With this technique, only heat needs to be provided, with more heat at some times and less heat at other times. The advantage of "ovenizing" is that heating is generally easier to accomplish within a device than cooling. But there are many disadvantages, including: noise is almost always higher at higher temperatures; device lifetime is reduced at higher temperatures; reliability is lower at higher temperatures; mechanical stability (e.g., creep of metals or aging of polymers) degrades at higher temperatures; and significant power is required to maintain higher temperatures. Further, these disadvantages tend to get worse exponentially as temperatures increase.

For the reasons stated above and for other reasons stated below which will become apparent to those skilled in the art upon reading and understanding the specification, there is a need in the art for alternate systems and methods for providing device temperature stabilization.

SUMMARY

A temperature stabilized device and method for temperature stabilization are provided. The temperature stabilized device comprises a substrate having a first surface, at least one component mounted on the first surface of the substrate, and a first conformal layer comprising a thermoelectric material, with the first conformal layer over the at least one component. A first temperature control circuit is electrically coupled to the first conformal layer. The first temperature control circuit is configured to control a current through the first conformal layer. The current through the first conformal layer is controlled to maintain the at least one component at a target operating temperature.

DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which:

FIG. 1A is a cross-sectional side view of a temperature stabilized device, with a conformal layer of thermoelectric (TE) material, according to one embodiment;

FIG. 4 is a diagram illustrating a temperature controller device that can be implemented with the temperature stabilized device of FIG. 2 according to an alternative embodiment;

DETAILED DESCRIPTION

Figure 1B:
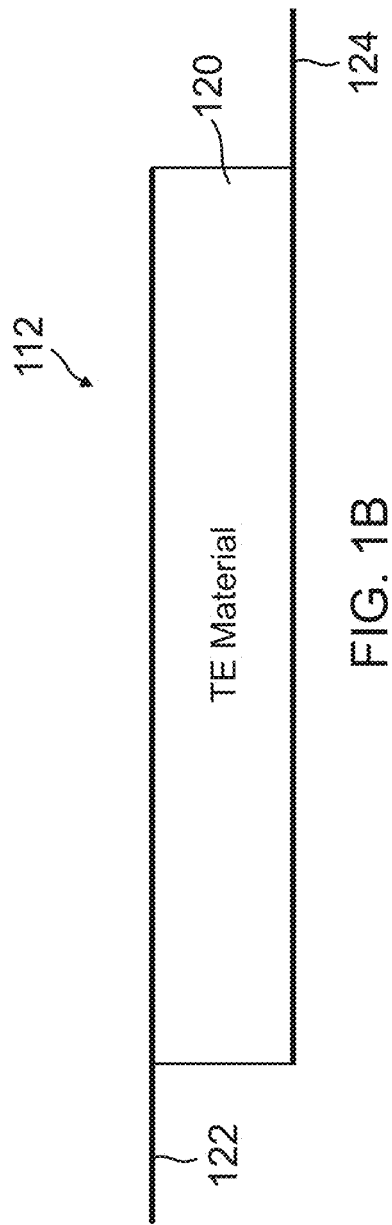
FIG. 1B is a diagram illustrating one embodiment of a conformal layer of TE material.

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical, and electrical changes may be made without departing from the scope of the present invention. The following detailed description is, therefore, not to be taken in a limiting sense.

Systems and methods for temperature stabilization of a device are disclosed herein. In general, a conformal layer of one or more thermoelectric (TE) materials is employed to stabilize the device temperature. As described hereafter, different zones of conformal layers of TE material may be applied in a patterned fashion in some embodiments.

As used herein a "conformal layer" or "conformal coating" can include, in one embodiment, a homogenous layer or coating composed of one type of TE material, such as a doped n-type material or a doped p-type material. In this embodiment, conductors are attached to both the top surface and the bottom surface of the TE material. A current is passed from one conductor, through the TE material, and then out the other conductor to effect a temperature change in the TE material.

In another embodiment, the "conformal layer" or "conformal coating" can include two or more different TE materials, such as doped n-type and doped p-type regions of TE material. In this embodiment, separate conductors are attached to the top surfaces of each of the n-type and p-type regions, and another conductor electrically connects the bottom surfaces of the n-type and p-type regions. In order to effect a temperature change, a current is passed from the conductor attached to the top surface of the n-type region, through the n-type TE material, then through the bottom conductor to the p-type TE material, and finally out through the conductor attached to the top surface of the p-type region.

In the thermoelectric or Peltier effect, a current applied across a TE junction that includes two distinct TE materials, such as n-type and p-type materials, causes a temperature change. The TE materials can produce both heating and cooling, and therefore, in one embodiment, enable temperature stabilization at a moderate or low temperature. The use of a relatively lower stabilization temperature reduces or eliminates the problems associated with high temperature standard ovenization, and offers many advantages over stabilization at a high temperature.

In various embodiments, the TE material is applied as a conformal layer or coating film, rather than a traditional rigid inorganic TE material. The TE material may comprise a polymer, nanoparticles, nanoparticles embedded in a polymer, or other coating films. In addition, different TE materials may be formed to have a microstructure with TE junctions where the different TE materials interface each other. The TE materials can be applied as conformal layers or coating films by any appropriate technique, such as, but not limited to, spray coating, dip coating, spinning, ink jet printing, or other conventional coating or deposition techniques.

The TE material can be applied over a wide range of surface topographies, such as over a surface of a circuit board where components including sensors and electronics of varying shapes and dimensions have been mounted. The result is a conformal layer of TE material over the components, in which the conformal layer has consistent thermal contact with every exposed surface of the circuit board and components in the region of the circuit board where the TE material is applied. Finally, the conformal layer of TE material can be patterned to allow local temperature control over the device (e.g., the circuit board) within different zones rather than only a single global temperature control. This results in faster stabilization, and significantly better control of temperature gradients and temperature transients across the device.

Further details of the present systems and methods are described hereafter with reference to the drawings.

FIG. 1A illustrates a temperature stabilized device 100 according to one embodiment. The device 100 includes a substrate 105 having a first surface 107 on which one or more components 110 are mounted. A single conformal layer 112 of TE material covers components 110. A temperature control circuit, which includes a temperature controller 115 and at least one temperature sensor 116, is electrically coupled to conformal layer 112. In one embodiment, the temperature control circuit is configured to control a current through TE junctions in conformal layer 112.

In one embodiment, device 100 comprises a circuit containing a micro-electrical-mechanical systems (MEMS) device, or part of a MEMS device. For example, device 100 can be a MEMS gyroscope, or part of a MEMS gyroscope, which outputs rotation rate measurements. In other embodiments, device 100 can be an application specific integrated circuit (ASIC), or a single component device such as a semiconductor laser.

In some implementations, substrate 105 comprises a circuit substrate or board such as a printed circuit board (PCB), on which a plurality of device components is mounted. In other implementations, substrate 105 may include another type of surface where temperature control is desired, such as a substrate of a self contained integrated circuit, a semiconductor laser substrate, or the like.

The components 110 may comprise electrical, optical, or mechanical components, with varying shapes and dimensions, and which produce varying degrees of heating when in operation. For example, components 110 can be sensors and electronics of varying shapes and dimensions, and which produce varying degrees of heating when in operation. In different implementations, components 110 may form at least part of an overall system for obtaining and processing sensor measurements, such as magnetic, pressure and/or inertial measurements, for example. In other implementations, components 110 may comprise resonating or timing components such as used in clocks, communications, or any other device that produces an output of data susceptible to variation due to changes in temperature. In other implementations, components 110 may comprise optical components such as semiconductor lasers, photodetectors, and waveguides.

The TE material of conformal layer 112 may comprise a polymer, nanoparticles, nanoparticles embedded in a polymer, or other coating films. The conformal layer 112 can be composed of one type of TE material, such as an n-type material or a p-type material. Alternatively, conformal layer 112 can include a microstructure composed of two or more different TE materials, such as n-type and p-type materials, which form a plurality of TE junctions where the different TE materials interface with each other. The conformal layer 112 can be applied over components 110 on substrate 105 by using conventional coating or deposition techniques.

In one exemplary embodiment, conformal layer 112 includes a homogenous layer 120 of TE material, with a first conductor 122 attached to a top surface of homogenous layer 120, and a second conductor 124 attached to a bottom surface of homogenous layer 120, as shown in FIG. 1B. In this configuration, a current passes from first conductor 122 on the top surface, through the TE material, and then out second conductor 124 on the bottom surface.

Figure 1C:
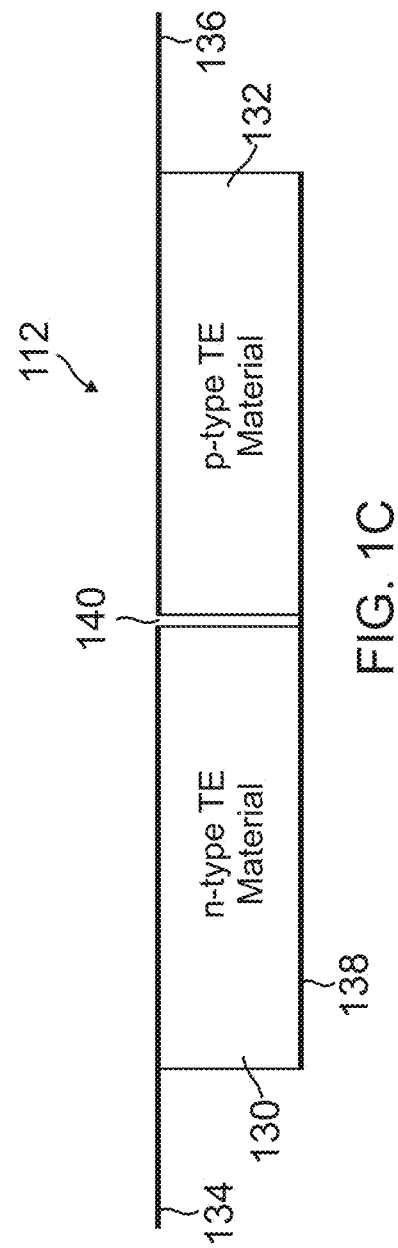
FIG. 1C is a diagram illustrating another embodiment of a conformal layer of TE material.

In another exemplary embodiment, conformal layer 112 includes a microstructure combination of at least one n-type region 130 of TE material and at least one p-type region 132 of TE material, as illustrated in FIG. 1C. In this embodiment, a first conductor 134 is attached to a top surface of n-type region 130, and a second conductor 136 is attached to a top surface of p-type region 132. A third conductor 138 is attached to both bottom surfaces of n-type region 130 and p-type region 132. The third conductor 138 connects a TE junction 140 where n-type region 130 and p-type region 132 interface with each other. In this configuration, a current passes from conductor 134 on the top surface of n-type region 132, through the n-type TE material, then through conductor 138, which electrically connects the bottom surface of n-type region 130 to the bottom surface of p-type region 132. The current then passes through the p-type TE material, and finally out through conductor 136 on the top surface of p-type region 132.

It will be understood that current can also pass in the opposite directions to the directions described above for the embodiments of FIGS. 1B and 1C. It will also be recognized that the top surface conductors 134 and 136 in FIG. 1C can be respectively attached to the bottom surfaces of n-type region 130 and p-type region 132 in place of conductor 138, while conductor 138 can be attached to both of the top surfaces of n-type region 130 and p-type region 132 in place of conductors 134 and 136, without changing the scope of the described embodiment.

The temperature controller 115 can be implemented using a conventional processing unit configured for temperature monitoring and control, with feedback from temperature sensor 116. The temperature sensor 116 may be mounted to substrate 105 and/or embedded within conformal layer 112. In one embodiment, temperature sensor 116 is a conventional electronic or mechanical sensor device mounted on the surface of substrate 105. In other embodiments, temperature sensor 116 may composed of a TE material. For example, in one implementation, temperature sensor 116 can be composed of the same TE material as used to form conformal layer 112, with temperature sensor 116 patterned so that it is separate from the heater/cooler portion of conformal layer 112. In another implementation, temperature sensor 116 can be composed of a different TE material than conformal layer 112, and can be buried beneath the heater/cooler portion of conformal layer 112.

In operation, a current through conformal layer 112 is controlled by temperature controller 115 to maintain the temperature of components 110 at a target temperature. In alternate implementations, the target temperature may be a low to moderate temperature relative to the operating range of device 100. For example, where device 100 has a normal operating temperature range from about −55° C. to about 85° C., temperature controller 115 may be operated to maintain the temperature of components 110 at a specific target temperature within a moderate temperature range (for example, from about 10° C. to about 40° C.), or at a specific target temperature within a lower temperature range (for example, less than about 10° C.).

In one embodiment, temperature control is achieved by temperature controller 115 using temperature feedback from temperature sensor 116. The heat produced by components 110 conductively reaches temperature sensor 116, which then provides a temperature signal back to temperature controller 115, so that temperature controller 115 can adjust the current injected through the TE material to maintain a target temperature.

When conformal layer 112 includes a microstructure composed of two or more different TE materials, TE junctions are formed where the different materials interface each other. In such an implementation, temperature controller 115 is electrically coupled to conformal layer 112, which injects a current through the TE junctions, producing either a heating or cooling effect, depending on the direction of current applied by temperature controller 115. In one embodiment, the degree of heating or cooling may also be adjusted by temperature controller 115 by regulating the magnitude of current through the junction.

For example, temperature controller 115 may be configured to maintain temperature stabilization at an operating temperature of about 20° C. Where temperature sensor 116 senses a temperature less than about 20° C. (at about −20° C., for example), temperature controller 115 can apply a current through conformal layer 112 with a direction and magnitude to produce heating of components 110. Where temperature sensor 116 senses a temperature greater than about 20° C. (at about 50° C., for example), temperature controller 115 can apply a current through conformal layer 112 with a direction and magnitude to produce cooling of components 110.

Figure 2:
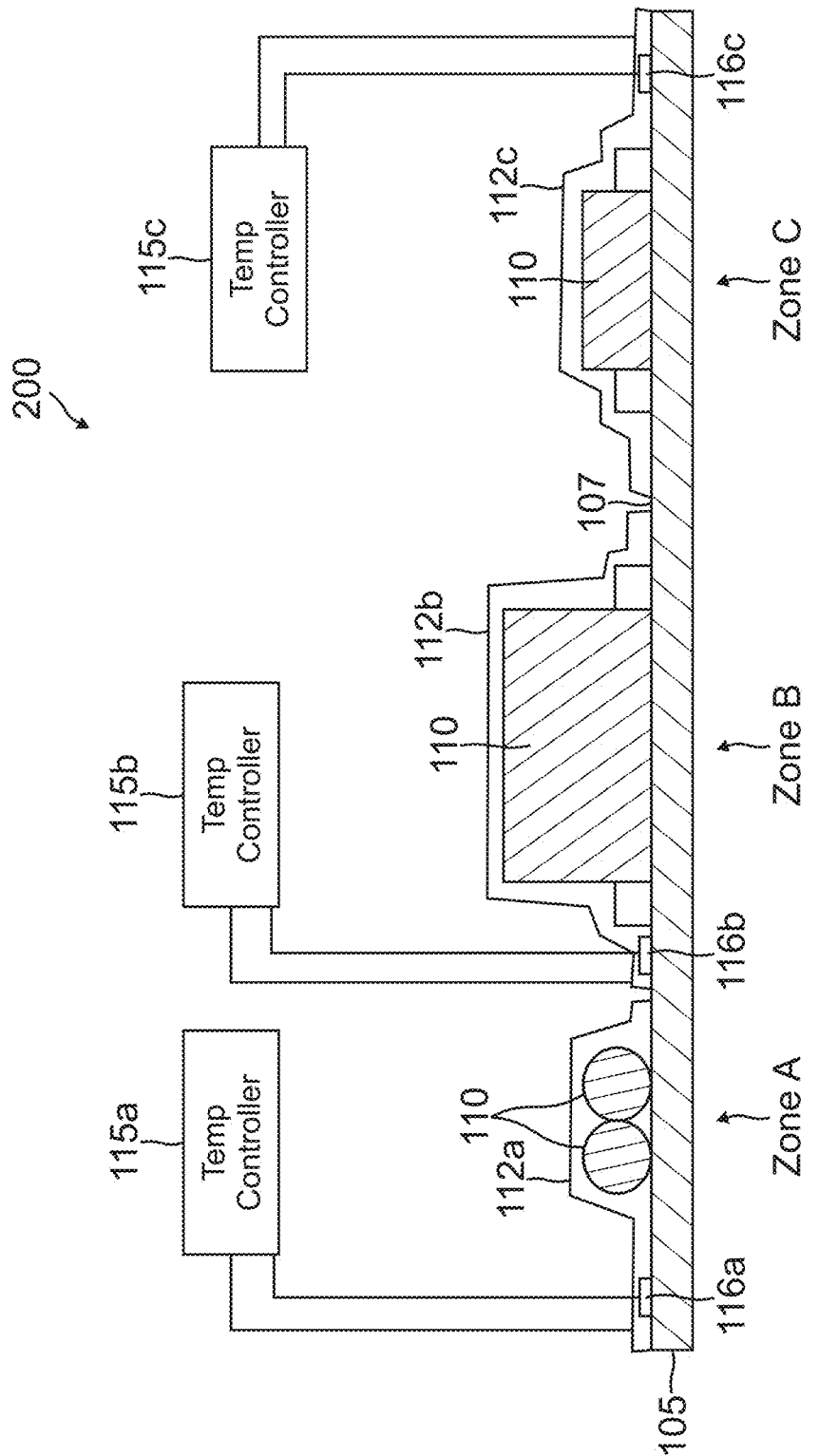
FIG. 2 is a cross-sectional side view of a temperature stabilized device, with a conformal layer of TE material, patterned into multiple, independently-controllable zones, according to another embodiment.

FIG. 2 illustrates a temperature stabilized device 200 according to another embodiment. The device 200 again includes a substrate 105, and a plurality of components 110, such as described above for device 100. The surface 107 of substrate 105 is subdivided into a plurality of temperature control zones such that different components 110 reside within different temperature control zones, which are identified as Zone A, Zone B, and Zone C in FIG. 2, for example. Independent conformal layers 112a, 112b, and 112c of TE materials are applied over components 110 in each of Zones A, B, and C. The conformal layers of TE materials may be independently operated to warm or cool components 110 in the same manner as described above for FIG. 1A.

In this implementation, temperature stabilization of components 110 is compartmentalized. That is, within each of the temperature control Zones A, B, and C, temperature stabilization is maintained by independent temperature controllers 115a, 115b, and 115c. In addition, a set of temperature sensors 116a, 116b, and 116c are each connected respectively to temperature controllers 115a, 115b, and 115c.

Although FIG. 2 illustrates device 200 as having substrate 105 and components 110 divided into three different temperature control zones, it should be appreciated that in other implementations, any arbitrary number of temperature control zones (i.e., greater or less than three) may be established without departing from the teachings herein. Similarly, temperature sensors 116a, 116b, and 116c may each themselves comprise a plurality of temperature sensor units distributed around their respective temperature control zones.

As shown in FIG. 2, one or more components 110 within the region of substrate 105 that fall within Zone A are covered with conformal layer 112a. The one or more components 110 within the region of substrate 105 that fall within Zone B are covered with conformal layer 112b. The one or more components 110 within the region of substrate 105 that fall within Zone C are covered with conformal layer 112c. Each of conformal layers 112a, 112b, and 112c of TE materials are physically and electrically separated from each other so that each may be controlled to heat or cool independently from the other.

For example, in Zone A, device 200 may comprise a temperature control circuit that includes temperature controller 115a coupled to temperature sensor 116a, and further coupled to conformal layer 112a. In the same manner described above with respect to FIG. 1A, temperature controller 115a controls the current through conformal layer 112a, based on a temperature feedback signal from temperature sensor 116a, to maintain components 110 within Zone A at a target temperature.

For Zone B, device 200 may comprise a temperature control circuit that includes temperature controller 115b coupled to temperature sensor 116b, and further coupled to conformal layer 112b. The temperature controller 115b controls the current through conformal layer 112b, based on a temperature feedback signal from temperature sensor 116b, to maintain components 110 within Zone B at a target temperature.

Similarly, for Zone C, device 200 may comprise a temperature control circuit that includes temperature controller 115c coupled to temperature sensor 116c, and further coupled to conformal layer 112c. The temperature controller 115c controls the current through conformal layer 112c, based on a temperature feedback signal from temperature sensor 116c, to maintain components 110 within Zone C at a target temperature.

By configuring temperature controllers 115a, 115b, and 115c with the same target temperature setpoint (i.e., the temperature at which temperature stabilization is desired), the plurality of temperature control zones can be independently operated to maintain a uniform temperature across all components 110 on substrate 105. That is, each of the conformal layers of TE materials applied over each temperature control zone may apply heating or cooling independently to maintain a uniform temperature across all components 110 on substrate 105.

For example, components 110 within Zone B may produce relatively more heat during operation than components 110 within Zone A or Zone C. In this example, temperature controllers 115a, 115b, and 115c are each configured with a target temperature of 20° C. and the ambient temperature around device 100 is cooler than this target temperature. Where components 110 within Zone A produce little heat themselves, temperature sensor 116a may sense a temperature less than the 20° C. target temperature (−20° C., for example). The temperature controller 115a reacts by injecting current through conformal layer 112a with a direction and magnitude to produce a heating of components 110 within Zone A to reach and maintain the target temperature.

Meanwhile, components 110 within Zone B produce a significant amount of heat so that temperature sensor 116b senses a temperature greater than the 20° C. target temperature (50° C., for example). The temperature controller 115b reacts by injecting current through conformal layer 112b with a direction and magnitude to produce a cooling of components 110 within Zone B to reach and maintain the target temperature. With this configuration, each temperature control zone may be independently adjusted so that all components 110 on substrate 105 operate at the same temperature, reducing imbalances in the way each of the various components 110 function.

Figure 3A:
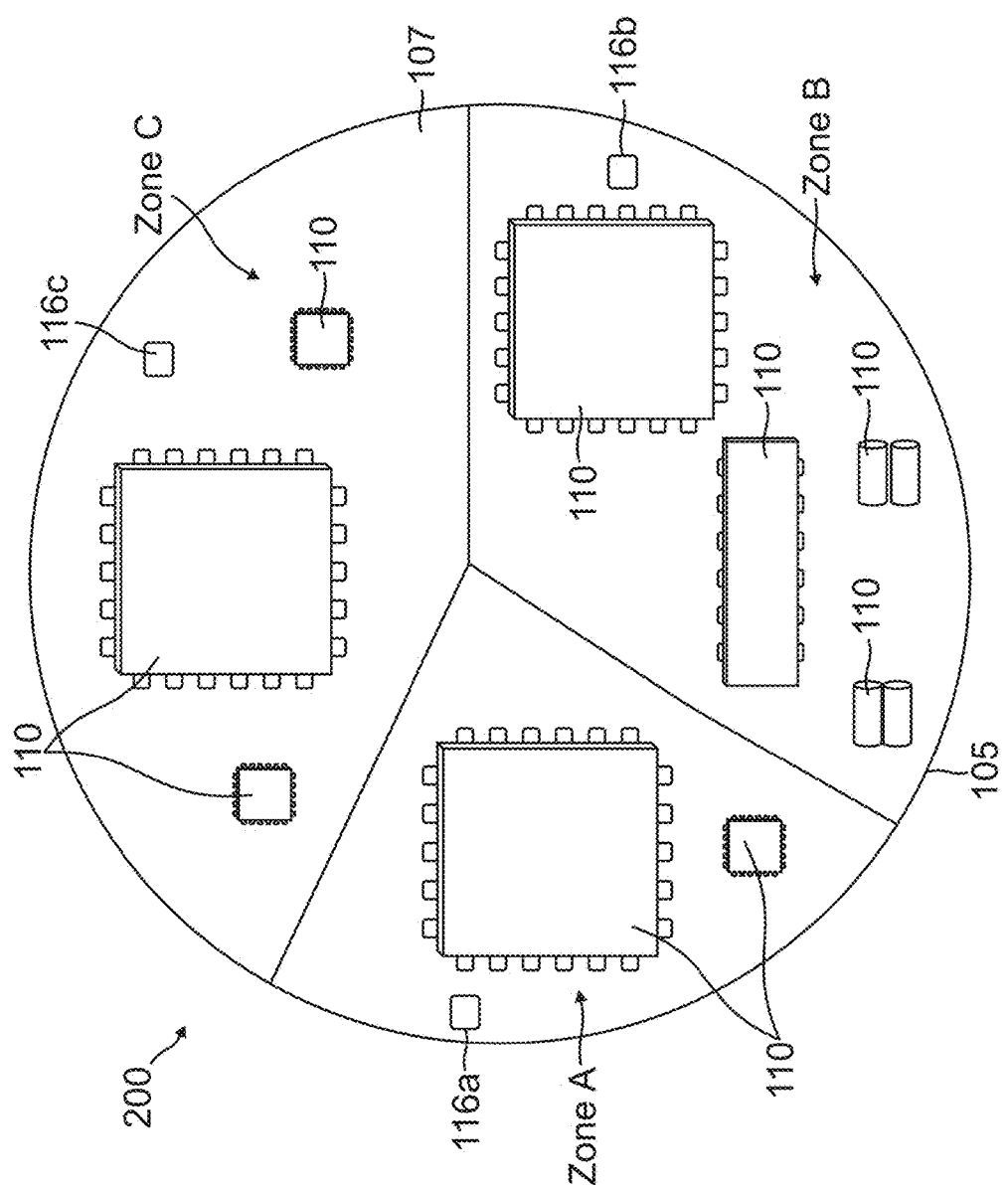
FIG. 3A is top view of the temperature stabilized device of FIG. 2, shown without the multiple, independently-controllable zones.
Figure 3B:
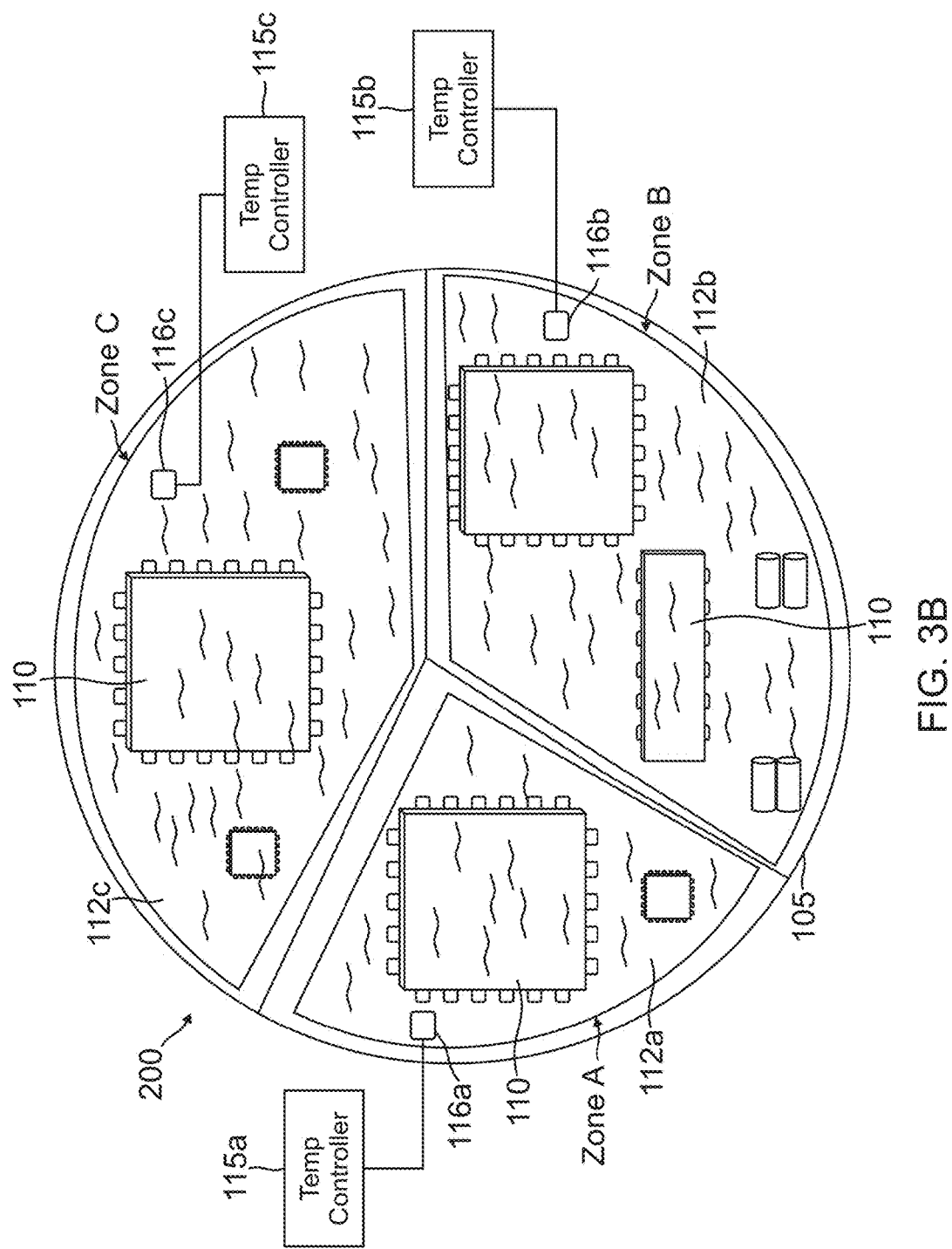
FIG. 3B is a top view of the temperature stabilized device of FIG. 2, shown with the multiple, independently-controllable zones.

FIG. 3A is a top view of temperature stabilized device 200 described for FIG. 2, shown without the multiple, independently-controllable zones of TE materials. FIG. 3B is a top view of device 200 shown with the multiple, independently-controllable zones of TE materials. FIGS. 3A and 3B illustrate an example lay-out of the surface of substrate 105 subdivided into temperature control Zones A, B, and C, with components 110 and temperature sensors 116a, 116b, and 116c, respectively within Zones A, B, and C. Although FIGS. 3A and 3B illustrate the temperature control zones as pie shaped wedges, it should be appreciated that the surface of substrate 105 may be subdivided into different temperature control zones using any pattern arranged to meet the temperature stabilization needs of device 200.

As illustrated in FIG. 3B, conformal layers 112a, 112b, and 112c respectively cover each of Zones A, B, and C. The applied TE materials are patterned to form the conformal layers over the components and temperature sensors within a particular temperature control zone. In Zone A, a temperature control circuit includes temperature controller 115a coupled to temperature sensor 116a, and also coupled to conformal layer 112a. In Zone B, a temperature control circuit includes temperature controller 115b coupled to temperature sensor 116b, and also coupled to conformal layer 112b. In Zone C, a temperature control circuit includes temperature controller 115c coupled to temperature sensor 116c, and also coupled to conformal layer 112c.

FIG. 4 illustrates a temperature controller device 310 that can be implemented with temperature stabilized device 200, according to an alternative embodiment. The temperature controller device 310 can include two or more of temperature controllers 115a, 115b, or 115c, which can be integrated into temperature controller device 310. The temperature controller device 310 receives temperature data from two or more of temperature sensors 116a, 116b, and 116c, and outputs signals to the respective conformal layers 112a, 112b, and 112c to control temperatures in their respective temperature control zones.

In one such embodiment, temperature controller device 310 adjusts injection current through each of conformal layers 112a, 112b, and 112c based on a function of temperature data from multiple temperature sensors. For example, in one embodiment, temperature controller device 310 adjusts current injection through each of conformal layers 112a, 112b, and 112c based on an average, or weighted average, of temperature data from temperature sensors 116a, 116b, and 116c.

Figure 5:
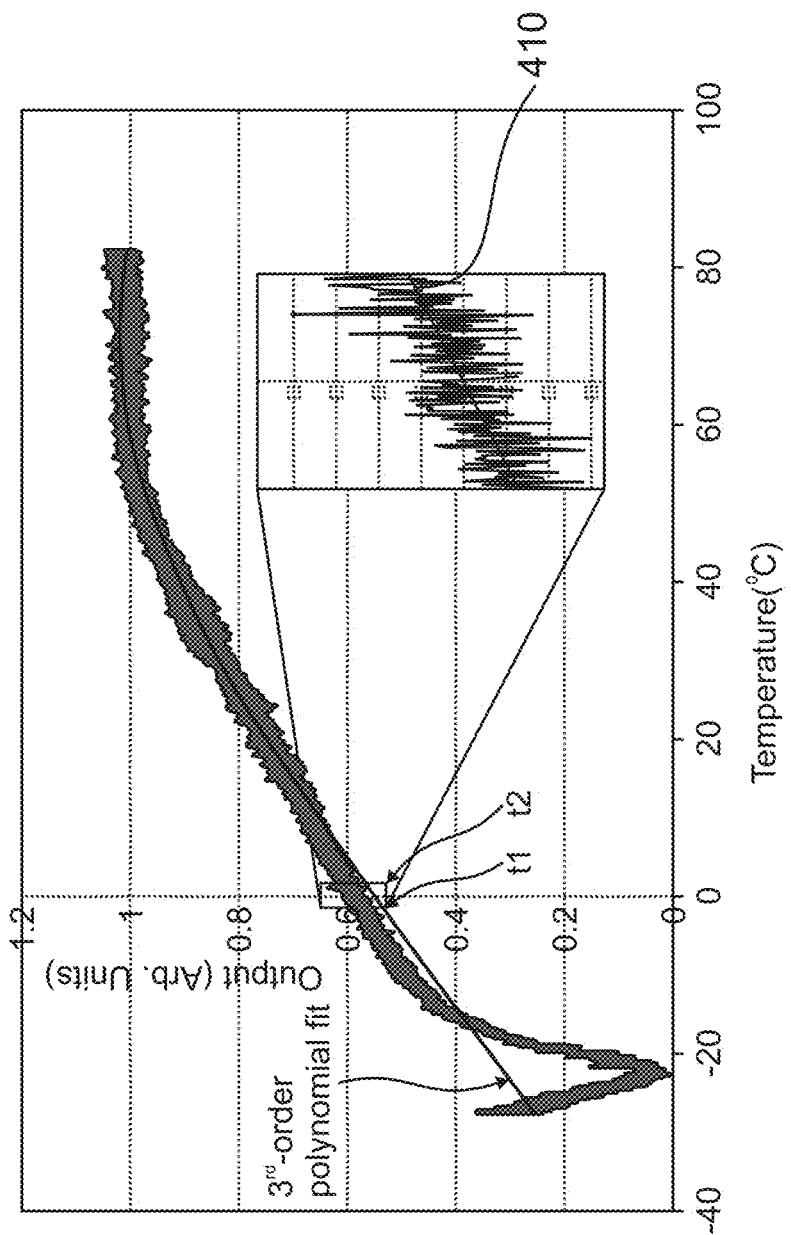
FIG. 5 is a graph of output with respect to temperature for an example embodiment.

With the temperature stabilized device operating under any of the conformal TE material layer temperature stabilizing schemes described herein, temperature stabilization across the device will provide that each of the device components are uniformly operating within a stabilized temperature range. This is shown in the graph of FIG. 5, in which device output with respect to temperature is plotted for an exemplary embodiment. From temperature $t_1$ to temperature $t_2$, output errors due to temperature variations may be bound and further characterized at various points between temperatures $t_1$ and $t_2$ along a bias error curve 410. The output "errors" refers to any deviations of the real output from the calibrated output, which is shown as the $3^{rd}$ order polynomial fit in FIG. 5. While the output errors might be very large, such as in the region around −25° C. as shown in FIG. 5, for example, if the temperature is stabilized at about 0° C., the output is very well behaved and the errors are small.

Figure 6:
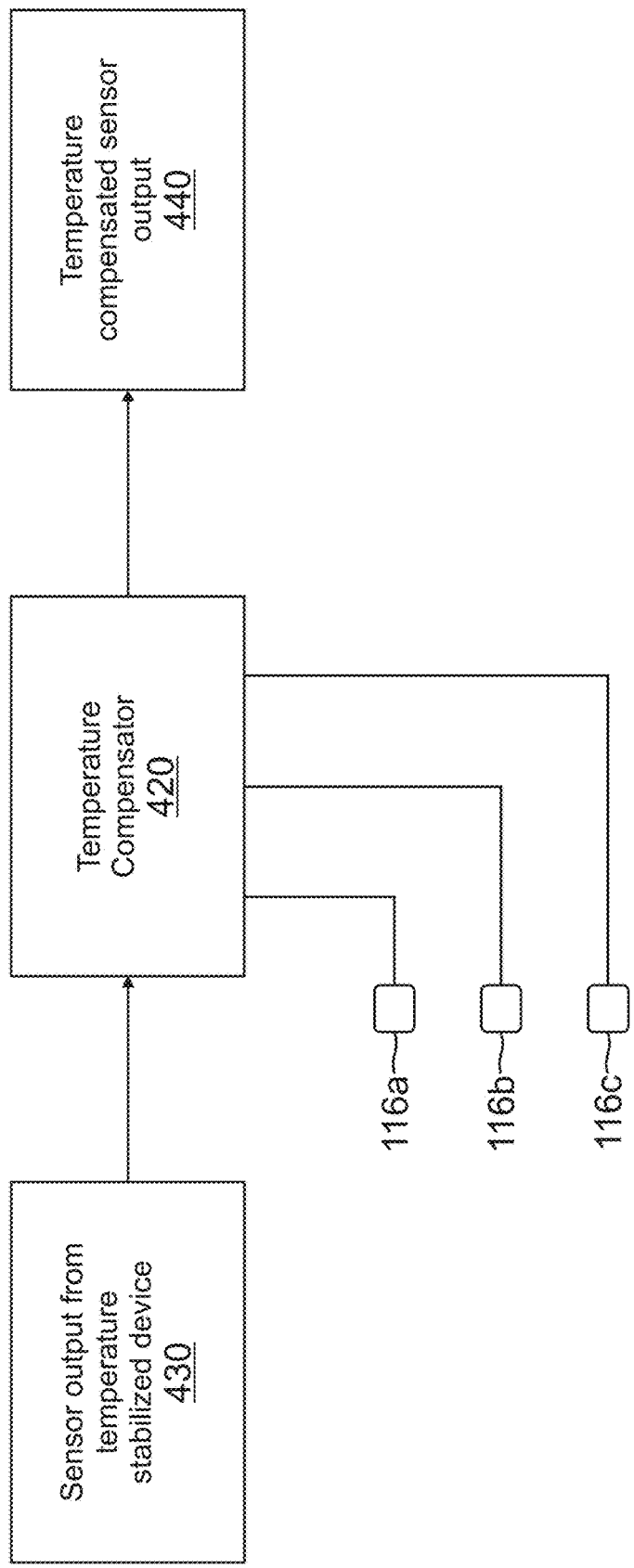
FIG. 6 is a diagram illustrating a temperature compensator that can be implemented with the temperature stabilized device of FIG. 2 according to one embodiment.

In one embodiment, known characterization of output errors may be used to further provide a temperature compensation correction applied to measurement data generated by the temperature stabilized device. For example, as shown in FIG. 6, a temperature compensator 420 may be loaded with sensor output measurement data from a temperature stabilized device (block 430). The temperature compensator 420 also receives temperature measurement data from one or more of temperature sensors 116a, 116b, and 116c. These temperature sensors may be embedded within the conformal layer of TE material in each of the temperature control zones. The temperature compensator 420 can employ a known characterization of bias errors (e.g., bias error curve 410 shown in FIG. 5), to calculate temperature compensation values that are applied to the measurement data generated by the temperature stabilized device. The temperature compensator 420 then outputs temperature compensated sensor output measurement data (block 440).

Figure 7:
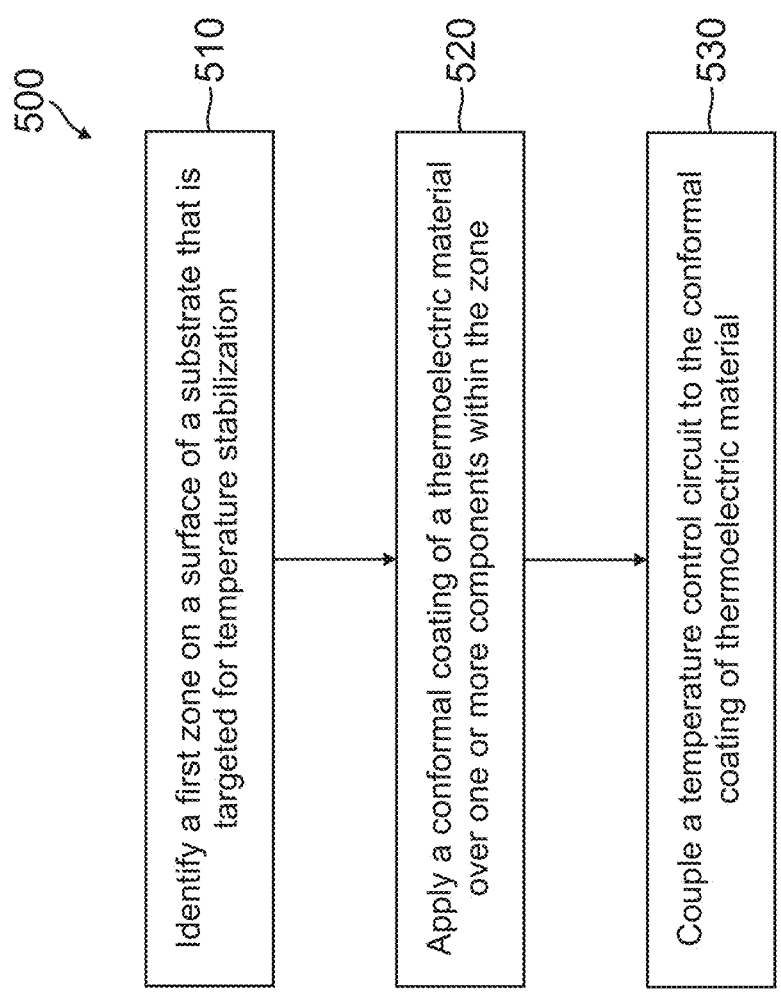
FIG. 7 is a flow diagram illustrating a method according to one embodiment.

FIG. 7 is a flow chart illustrating a method 500 for providing temperature stabilization according to one embodiment. In various implementations, method 500, in whole or in part, may be used in combination with any of the other embodiments described herein. As such, descriptions of elements mentioned previously apply to like named elements mentioned with respect to method 500 and vice versa. The method 500 begins at 510 with identifying at least a first zone on a surface of a substrate that is targeted for temperature stabilization. Identifying the first zone at 510 may be applied to a device where a single temperature control zone is to be defined, or a device where the surface of a substrate is to be subdivided into multiple temperature control zones, such as illustrated in FIG. 2 or FIGS. 3A-3B.

Next, method 500 proceeds at 520 with applying a conformal coating of a TE material over one or more components within the first zone. Temperature stabilization is achieved using this conformal TE material. The method 500 then proceeds at 530 with coupling a temperature control circuit to the conformal coating of thermoelectric material. The temperature control circuit may comprise a temperature sensor, which may also be embedded within the conformal coating of TE material at step 520 or otherwise implemented, and may also comprise a temperature controller that is electrically coupled to the TE material to inject current. Either a heating or cooling effect is produced within the first zone, depending on the direction of applied current by the temperature controller. The degree of heating or cooling can be adjusted by the temperature controller by regulating the magnitude of current injected through the TE junctions of the TE material. The temperature sensor then provides a temperature signal back to the temperature controller so that the temperature controller can adjust the current injected through the TE material to maintain a target temperature.

As mentioned above, while the substrate in many implementations will comprise a circuit substrate or board such as a printed circuit board, it is not intended that the term "substrate" be so limited. That is, while the embodiments above illustrate circuits and other components on a substrate as the devices targeted for temperature stabilization, further embodiments and implementations may apply the above teachings to any number of other subject substrates where temperature control/stabilization is desired. For example, temperature stabilization using a coating of conformal TE material may be applied to a "device" or a "system" or an "apparatus" that is targeted for temperature stabilization.

EXAMPLE EMBODIMENTS

Example 1 includes a temperature stabilized device, comprising: a substrate having a first surface; at least one component mounted on the first surface of the substrate; a first conformal layer comprising a thermoelectric material, the first conformal layer over the at least one component; and a first temperature control circuit electrically coupled to the first conformal layer, the first temperature control circuit configured to control a current through the first conformal layer; wherein the current through the first conformal layer is controlled to maintain the at least one component at a target operating temperature.

Example 2 includes the device of Example 1, wherein the substrate comprises a printed circuit board, an integrated circuit substrate, or a semiconductor laser substrate.

Example 3 includes the device of any of Examples 1-2, wherein the at least one component comprises one more of an electrical component, an optical component, or a mechanical component.

Example 4 includes the device of any of Examples 1-3, wherein the at least one component is part of a sensor device.

Example 5 includes the device of any of Examples 1-4, wherein the least one component comprises a magnetic sensor, a pressure sensor, or an inertial measurement sensor.

Example 6 includes the device of any of Examples 4-5, wherein the sensor device is a micro-electrical-mechanical systems (MEMS) device.

Example 7 includes the device of any of Examples 1-3, wherein the at least one component is part of a clock or a resonator.

Example 8 includes the device of any of Examples 1-3, wherein the least one component comprises a semiconductor laser, a photodetector, or a waveguide.

Example 9 includes the device of any of Examples 1-8, wherein the thermoelectric material comprises a polymer, nanoparticles, or nanoparticles embedded in a polymer.

Example 10 includes the device of any of Examples 1-9, wherein the conformal layer comprises two or more different thermoelectric materials, the conformal layer including a plurality of thermoelectric junctions where the different thermoelectric materials interface with each other.

Example 11 includes the device of Example 10, wherein the different thermoelectric materials comprise at least one n-type thermoelectric material region and at least one p-type thermoelectric material region that interface with each other and are electrically connected at a thermoelectric junction.

Example 12 includes the device of any of Examples 1-11, wherein the first temperature control circuit comprises a first temperature controller electrically coupled to the first conformal layer; and a first temperature sensor in contact with the first conformal layer, the first temperature sensor in communication with the first temperature controller; wherein the first temperature controller is configured to control a current through the first conformal layer based on a feedback signal from the first temperature sensor.

Example 13 includes the device of Example 12, wherein the substrate is subdivided into a plurality of non-overlapping temperature control zones that each contain at least one component; and the first conformal layer of thermoelectric material covers at least one component within a first zone of the temperature control zones.

Example 14 includes the device of Example 13, further comprising a second conformal layer of thermoelectric material that covers at least one component within a second zone of the temperature control zones; and a second temperature control circuit electrically coupled to the second conformal layer of thermoelectric material, the second temperature control circuit configured to control a current through the second conformal layer of thermoelectric material.

Example 15 includes the device of Example 14, wherein the second temperature control circuit comprises a second temperature controller electrically coupled to the second conformal layer; and a second temperature sensor in contact with the second conformal layer, the second temperature sensor in communication with the second temperature controller.

Example 16 includes the device of Example 15, wherein the first and second temperature controllers are integrated into a single temperature controller device.

Example 17 includes the device of any of Examples 15-16, further comprising a temperature compensator operatively coupled to the temperature sensors and configured to calculate temperature compensation values that are applied to measurement data generated by the device.

Example 18 includes a temperature stabilization system, comprising: a circuit board having a first surface; a plurality of components mounted on the first surface of the circuit board, the components comprising at least part of a sensor device; a plurality of non-overlapping temperature control zones on the first surface of the circuit board, the temperature control zones each containing at least one of the components; a first conformal layer of thermoelectric material over at least one component within a first zone of the temperature control zones; a first temperature control circuit electrically coupled to the first conformal layer of thermoelectric material, the first temperature control circuit configured to control a current through the first conformal layer of thermoelectric material; one or more additional conformal layers of thermoelectric material that respectively cover at least one component within one or more of the other temperature control zones; and one or more temperature control circuits electrically coupled to the one or more additional conformal layers, the one or more temperature control circuits configured to respectively control a current through the one or more additional conformal layers; wherein the current through each of the conformal layers is controlled to maintain the components at a target operating temperature.

Example 19 includes a method for temperature stabilization of a device, the method comprising: identifying a first zone on a surface of a substrate that is targeted for temperature stabilization; applying a first conformal coating of thermoelectric material over one or more components on the substrate and within the first zone; and coupling a first temperature control circuit to the first conformal coating of thermoelectric material.

Example 20 includes the method of Example 19, further comprising: identifying one or more additional zones on the surface of the substrate that is targeted for temperature stabilization; applying one or more additional conformal coatings of thermoelectric material over one or more components on the substrate that are within the one or more additional zones, the one or more additional conformal coatings separated from the first conformal coating and from each other; and coupling one or more additional temperature control circuits respectively to the one or more additional conformal coatings.

Although specific embodiments have been illustrated and described herein, it will be appreciated by those of ordinary skill in the art that any arrangement, which is calculated to achieve the same purpose, may be substituted for the specific embodiment shown. This disclosure is intended to cover any adaptations or variations of the present invention. Therefore, it is manifestly intended that this invention be limited only by the claims and the equivalents thereof.

What is claimed is:

1. A temperature stabilized device, comprising:
a substrate having a surface, the substrate subdivided into a plurality of non-overlapping temperature control zones;
at least one component mounted on the surface of the substrate in each of the temperature control zones;
a first conformal layer comprising a thermoelectric material, the first conformal layer over the at least one component within a first zone of the temperature control zones;
a first temperature control circuit electrically coupled to the first conformal layer, the first temperature control circuit configured to control a current through the first conformal layer;
a second conformal layer comprising a thermoelectric material, the second conformal layer over the at least one component within a second zone of the temperature control zones; and
a second temperature control circuit electrically coupled to the second conformal layer, the second temperature control circuit configured to control a current through the second conformal layer;
wherein the current through the first conformal layer is controlled to maintain the at least one component within the first zone at a target operating temperature.

2. The device of claim 1, wherein the substrate comprises a printed circuit board, an integrated circuit substrate, or a semiconductor laser substrate.

3. The device of claim 1, wherein the at least one component comprises one more of an electrical component, an optical component, or a mechanical component.

4. The device of claim 1, wherein the at least one component is part of a sensor device.

5. The device of claim 1, wherein the least one component comprises a magnetic sensor, a pressure sensor, or an inertial measurement sensor.

6. The device of claim 4, wherein the sensor device is a micro-electrical-mechanical systems (MEMS) device.

7. The device of claim 1, wherein the at least one component is part of a clock or a resonator.

8. The device of claim 1, wherein the least one component comprises a semiconductor laser, a photodetector, or a waveguide.

9. The device of claim 1, wherein the thermoelectric material comprises a polymer, nanoparticles, or nanoparticles embedded in a polymer.

10. The device of claim 1, wherein the first conformal layer comprises two or more different thermoelectric materials, the first conformal layer including a plurality of thermoelectric junctions where the different thermoelectric materials interface with each other.

11. The device of claim 10, wherein the different thermoelectric materials comprise at least one n-type thermoelectric material region and at least one p-type thermoelectric material region that interface with each other and are electrically connected at a thermoelectric junction.

12. The device of claim 1, wherein the first temperature control circuit comprises:
a first temperature controller electrically coupled to the first conformal layer, and
a first temperature sensor in contact with the first conformal layer, the first temperature sensor in communication with the first temperature controller;
wherein the first temperature controller is configured to control a current through the first conformal layer based on a feedback signal from the first temperature sensor.

13. The device of claim 1, wherein the second temperature control circuit comprises:
a second temperature controller electrically coupled to the second conformal layer; and
a second temperature sensor in contact with the second conformal layer, the second temperature sensor in communication with the second temperature controller.

14. The device of claim 13, wherein the first and second temperature controllers are integrated into a single temperature controller device.

15. The device of claim 13, further comprising a temperature compensator operatively coupled to the temperature sensors and configured to calculate temperature compensation values that are applied to measurement data generated by the device.

16. A temperature stabilization system, comprising:
a circuit board having a surface;
a plurality of components mounted on the surface of the circuit board, the components comprising at least part of a sensor device;
a plurality of non-overlapping temperature control zones on the surface of the circuit board, the temperature control zones each containing at least one of the components;
a first conformal layer of thermoelectric material that covers at least one component within a first zone of the temperature control zones, the first conformal layer also covering at least a portion of the surface of the circuit board in the first zone;
a first temperature control circuit electrically coupled to the first conformal layer of thermoelectric material, the first temperature control circuit configured to control a current through the first conformal layer of thermoelectric material;
one or more additional conformal layers of thermoelectric material that respectively cover at least one component within one or more of the other temperature control zones; and
one or more additional temperature control circuits respectively electrically coupled to the one or more additional conformal layers, the one or more temperature control circuits configured to respectively control a current through the one or more additional conformal layers;

wherein the thermoelectric material of the conformal layers comprises a polymer, nanoparticles, nanoparticles embedded in a polymer, or a coating film;

wherein the current through each of the conformal layers is controlled to maintain the components at a target operating temperature.

17. A method for temperature stabilization of a device, the method comprising:

identifying a first zone on a surface of a substrate that is targeted for temperature stabilization;

applying a first conformal layer of thermoelectric material over one or more components on the substrate and within the first zone, the first conformal layer of thermoelectric material applied by a coating process or a deposition process;

coupling a first temperature control circuit to the first conformal layer;

identifying one or more additional zones on the surface of the substrate that is targeted for temperature stabilization;

applying one or more additional conformal layers of thermoelectric material over one or more components on the substrate that are within the one or more additional zones, the one or more additional conformal layers separated from the first conformal layer and from each other, and coupling one or more additional temperature control circuits respectively to the one or more additional conformal layers.

* * * * *